United States Patent [19]

Rickard et al.

[11] Patent Number: 5,450,137
[45] Date of Patent: Sep. 12, 1995

[54] SIGNAL PROCESSING APPARATUS

[75] Inventors: Thomas W. Rickard; Peter M. Smith; David C. Conway-Jones, all of Hampshire; David J. Brown, Ashley Heath, all of England

[73] Assignee: International Business Machines Corporation, Armonk, N.Y.

[21] Appl. No.: 16,421

[22] Filed: Feb. 11, 1993

[30] Foreign Application Priority Data

Feb. 11, 1992 [EP] European Pat. Off. ............ 92301112

[51] Int. Cl.⁶ .......................... H04N 5/06; H04N 5/12
[52] U.S. Cl. ................................... 348/537; 348/524; 348/497; 331/1 A; 331/20; 331/25
[58] Field of Search ............... 358/148, 153, 154, 155, 358/158, 159, 167, 174, 176, 177, 336, 337, 340, 314, 319, 320, 327; 331/20, 1 A, 17, 21, 25; 348/500, 536, 537, 540, 541, 542, 543, 544, 545, 546, 521–524, 497; H04N 7/00, 5/04, 5/06, 5/12

[56] References Cited

U.S. PATENT DOCUMENTS

| | | | |
|---|---|---|---|
| 4,812,783 | 3/1989 | Honjo et al. | 358/158 |
| 4,821,098 | 4/1989 | Smeulers | 358/154 |
| 4,942,472 | 7/1990 | Imbert et al. | 358/158 |
| 4,996,596 | 2/1991 | Hirao et al. | 358/153 |

FOREIGN PATENT DOCUMENTS

| | | | |
|---|---|---|---|
| 0258042 | 8/1987 | European Pat. Off. | H03L 7/18 |
| 0343724 | 5/1989 | European Pat. Off. | H04N 5/95 |
| 0389894 | 10/1990 | European Pat. Off. | H04N 7/093 |
| 670020 | 4/1989 | Germany | H03L 7/18 |

OTHER PUBLICATIONS

Patent Abstracts of Japan vol. 010, No. 061 (E-387) 11 Mar. 1986 & JP-A-60 213 184 (Sony) 25 Oct. 1985 * abstract *.
Patent Abstracts of Japan vol. 015, No. 121 (E-1049) 25 Mar. 1991 & JP-A-30 09 615 (Toshiba) 17 Jan. 1991 * abstract *.

*Primary Examiner*—James J. Groody
*Assistant Examiner*—Michael H. Lee
*Attorney, Agent, or Firm*—Bernard D. Bogdon

[57] ABSTRACT

This specification concerns signal processing apparatus for processing line synchronization pulses in a line synchronization signal that define an analog video signal line period. The apparatus comprises a phase locked loop (40) for generating a clock signal of a frequency that is a multiple of the line synchronization signal frequency. The phase locked loop (40) comprises a counter (100) for dividing the clock signal by said multiple. The apparatus further comprises logic (110,50) for resetting the counter (100) upon detection of a spurious pulse introducing a time interval into the line synchronization signal of less than the line period of the video signal. The apparatus is particularly useful in image processing systems for digitizing analog video signals that have been replayed via a conventional, domestic video tape player, and therefore may comprise spurious line sync pulses introduced by playback head skip.

3 Claims, 4 Drawing Sheets

SIGNAL PROCESSING APPARATUS

The present invention relates to signal processing apparatus for correcting spurious line synchronisation pulses produced by head skip in a video tape player.

An analog video signal, such as that produced by a video camera, for example, is magnetically encoded onto video tape usually in a series of parallel tracks that run oblique of the path of the video tape. Each track represents one field of a video frame. The tracks representing odd numbered fields are interleaved with the tracks representing even numbered fields. Thus for a 625 line video frame, each track represents 325.5 lines each separated by a line synchronisation (sync) pulse.

A conventional domestic video tape player comprises a cylindrical playback head carrying two diametrically opposed magnetic pickups. In operation, the video tape is wrapped around the head as it passes from one reel onto another. The head is rotated in such a manner that one pickup reads from only the tracks representing the odd numbered fields and the other pickup reads from only the tracks representing the even numbered fields. The video signal is reproduced by switching between the two pickups as they alternately come into contact with successive tracks on the video tape. Reproduction of the video signal thus requires geometric and temporal alignment of the video tape movement to the rotation of the head. However, because in practice the extremes of successive tracks are not usually aligned with the exchange of the pickups, spurious line sync pulses are added to the replayed video signal. Each spurious line sync pulse effectively introduces a time interval between successive lines of the reproduced video signal towards the end of each field. The time interval is much shorter in length than the line period. This effect is sometimes referred to as "head skip."

The picture displayed by a conventional broadcast television receiver overscans the edges of the screen towards the end of one field and at the beginning of the next. This provides a period in which the receiver can resynchronise to input sync pulses between displaying successive video frames. Therefore, when such a receiver displays a picture based on a video signal reproduced by a conventional, domestic video tape player, the time interval introduced by a spurious line sync pulse does not noticeably distort the picture. However, some display devices, such as computer visual display devices for example, generate a picture that does not overscan the edges of the screen. The picture produced by such devices may therefore be noticeably distorted by the spurious time interval.

Some image processing systems comprise signal processing apparatus for digitising a video signal reproduced by a domestic video tape player recording. The signal processing apparatus is reliant in operation on the timely occurrence of line sync pulses corresponding to the video signal to control a sampling clock frequency. Typically, the signal processing apparatus comprises an analog to digital convertor for sampling the video signal and digitising each sample. The samples are taken at regular intervals determined by a clock signal. The clock signal is synchronised to the line sync pulses of the video signal by a phase-locked loop. The phase locked loop comprises a voltage controlled oscillator (VCO) for generating the clock signal and a counter for dividing the clock signal by the number of samples required in each line period. A phase comparator compares the line sync pulses with the output of the counter to generate a phase error signal. The phase error signal is applied to the VCO input to determine the frequency of the clock signal. The output of the counter thus provides negative feedback that operates to reduce the phase error signal to zero and thus to synchronise the clock signal to the line sync pulses. The sampling clock frequency is thus maintained constant as long as the line sync pulses remain coincident with the pulses at the output of the counter. However, because the time interval introduced by the spurious line sync pulse is much shorter in length than the line period, the spurious line sync pulse does not coincide with a pulse from the output of the counter. This produces a step variation in the sampling clock frequency and hence undesirable temporal distortion of the digitised video signal. Conventionally, the spurious line sync pulse produced by head skip has been compensated by varying the step response of the phase locked loop with complex and therefore expensive analog circuitry.

In accordance with the present invention, there is now provided signal processing apparatus for processing line synchronisation pulses in a line synchronisation signal that define an analog video signal line period, the apparatus comprising: a phase locked loop for generating a clock signal of a frequency that is a multiple of the line synchronisation signal frequency; and a counter within the phase locked loop for dividing the clock signal by said multiple; characterised in that the apparatus further comprises: logic for resetting the counter upon detection of any spurious pulse introducing a time interval into the line synchronisation signal of less than the line period of the video signal.

The present invention stems from a recognition that, the clock signal can be maintained constant despite the introduction, during reproduction of the video signal from a video tape recording, of spurious time intervals into the line sync signal by gating the spurious pulses defining the spurious time intervals away from the input of the phase locked loop and onto the reset input of the counter. The input of the phase locked is therefore masked by the logic from any spurious sync pulses in the line synchronisation signal. Thus, the present invention advantageously provides a digital solution to the problem of compensating for the spurious time intervals introduced by head skip that is a less complex and hence cheaper alternative to the conventional analog solution of varying the step response of the phase locked loop.

Preferably, the logic comprises a multiplexor for switching the line sync signal from a phase comparator input of the phase locked loop to a reset input of the counter for a reset period, less than the line period, in response to each line sync pulse in the line sync signal. Advantageously, the multiplexor may be implemented by a simple and therefore cheap arrangement of logic gates.

In a preferred embodiment of the present invention, the logic comprises a timer for switching a control input of the multiplexor from a first state to a second state for the reset period upon detection of trailing edges of the line sync pulses in the line sync signal. The timer may have a trigger input connected to the phase comparator input so that the multiplexor disconnects the line sync signal from the trigger input during the reset period and thus prevents extension of the reset period. Alternatively, the timer may be adapted to be non retriggerable so that the trigger input can remain connected to the line sync signal during the reset period.

It will now be appreciated that the timer may advantageously comprise a simple and therefore cheap monostable multivibrator.

In a preferred embodiment of the present invention, the multiplexor comprises a pair of AND gates, and the timer comprises a monostable circuit having inverted and non inverted outputs connected to the AND gates for respectively enabling different ones of the AND gates. The present invention can thus advantageously be implemented simply with conventional logic gates.

To maximise sensitivity to spurious sync pulses, the logic may be configured to set the reset period to substantially the difference between the line period and a line synchronisation pulse width.

It will be appreciated that the present invention extends to image processing apparatus, for processing an analog video signal having a line period identified by line synchronisation pulses in a line synchronisation signal, the apparatus comprising: a phase locked loop for generating a clock signal of a frequency that is a multiple of the line synchronisation signal frequency; a counter within the phase locked loop for dividing the clock signal by said multiple; and an analog to digital convertor for digitising samples of the video signal at intervals determined by a clock signal; characterised in that the apparatus further comprises: logic for resetting the counter upon detection of a spurious pulse introducing a time interval into the line synchronisation signal of less than the line period of the video signal.

A preferred embodiment of the present invention will now be described, by way of example only, with reference to the accompanying drawings in which.

Figure 1:
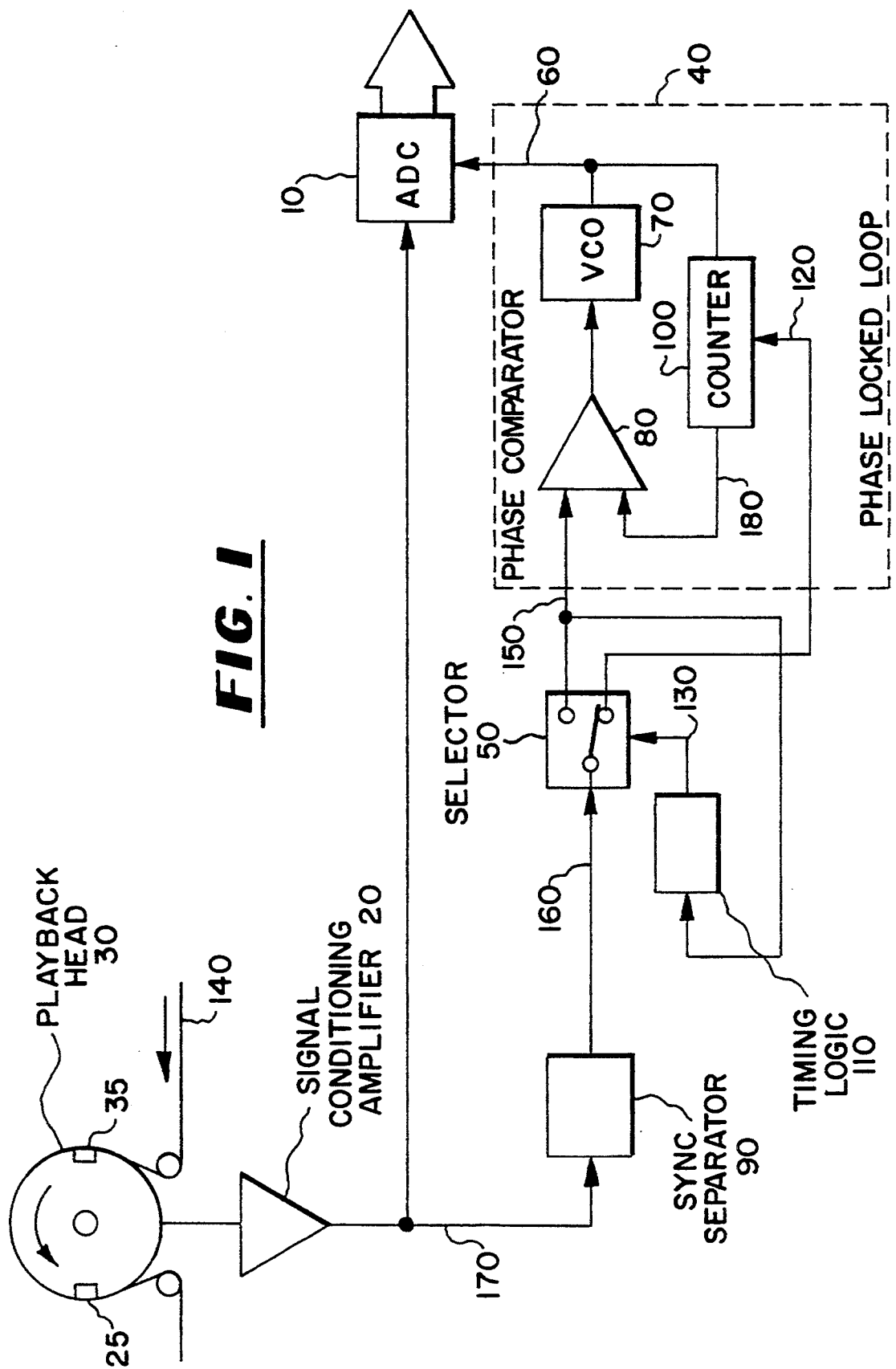
FIG. 1 is a block diagram of an example of signal processing apparatus of the present invention.

Referring first to FIG. 1, an analog video signal reproduced by a conventional domestic video tape player comprises a succession of fields each containing L5 lines of analog video data. Successive fields are separated by a field blanking interval equivalent in length to L2 lines of video data. Successive fields of the video signal are stored in successive tracks on the video tape. The video tape player has a cylindrical playback head carrying two diametrically opposed magnetic pickups. The video tape is wrapped around the head as it passes from one reel onto another. The head is rotated in such a manner that one pickup reads from only the tracks representing the odd numbered fields and the other pickup reads from only the tracks representing the even numbered fields. The video signal is reproduced by switching between the two pickups as they alternately come into contact with successive tracks on the video tape. In practise, a spurious line sync pulse PE is generated if the extremes of successive tracks are not aligned with the exchange in pickups. Spurious pulse PE is inserted L6 lines from the end of the active field. In a conventional television receiver, L1 lines at the end of one active field are overscanned beyond the bottom edge of the picture and are therefore not displayed. Similarly, L3 lines at the beginning of the next field are overscanned beyond the top edge of the picture. L6 is less than L1. Typically, L6 is 8 and L1 is 12. Therefore, the receiver is provided with a total of L6+L2+L3 line periods in which to lock onto the line period before the next field of video is displayed. However, some digital image processing systems may display a picture based on the video signal on a visual display unit that does not overscan, or within a window on such a display unit. Therefore, to avoid undesirable image disturbances during replay, the image processing system must compensate for the spurious pulse PE.

Figure 2:
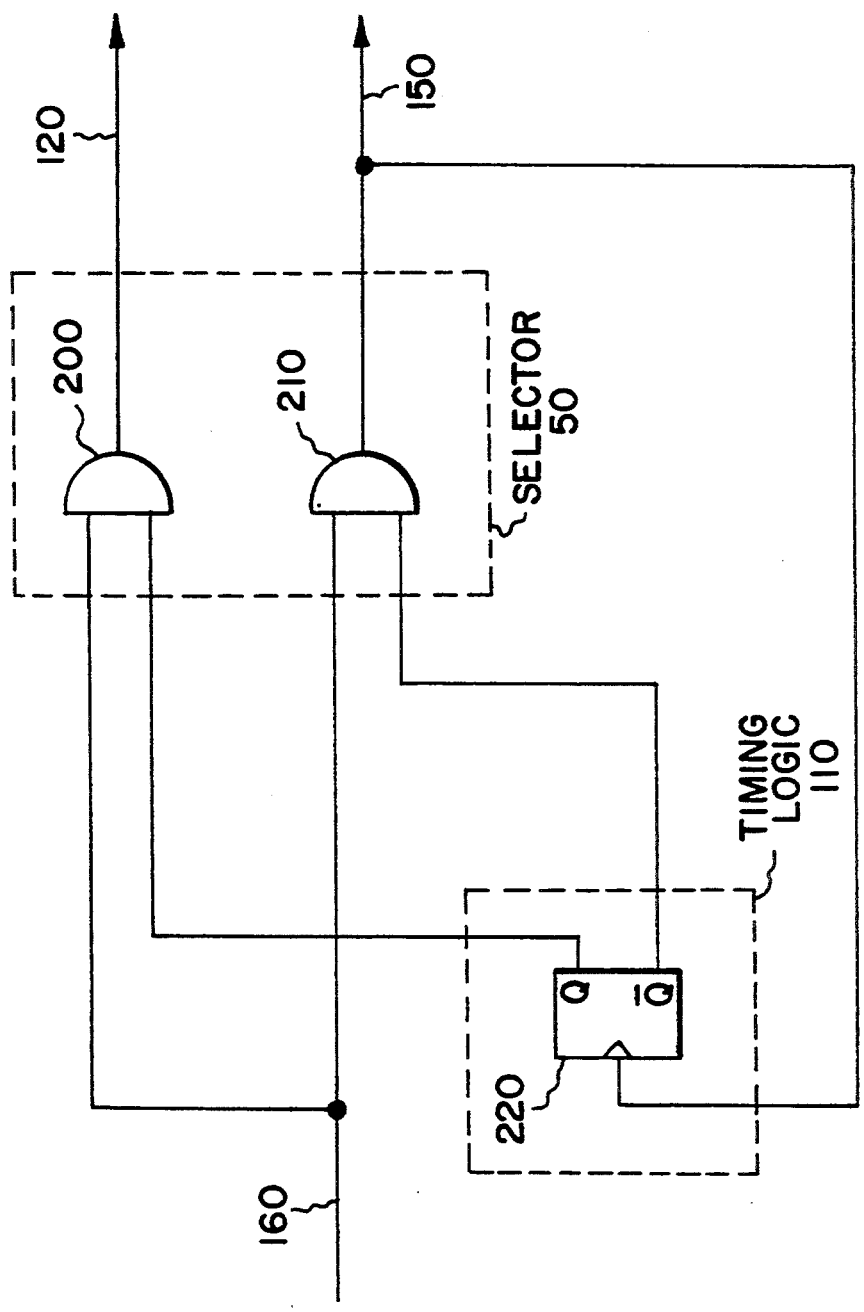
FIG. 2 is a block diagram of timing logic for signal processing apparatus of the present invention.

Referring now to FIG. 2, an example of signal processing apparatus of the present invention, for digitising an analog video signal reproduced by a conventional domestic video tape player, comprises an analog to digital convertor (ADC) 10 having an analog input 170 detachably connected, via a signal conditioning amplifier 20, to a playback head 30 of a video tape player. The ADC 10 has a sampling clock input 60 connected to the output of a phase locked loop 40. The output from the phase locked loop 40 is generated by a voltage controlled oscillator (VC0) 70. The VC0 70 has a control input connected to the output of a phase comparator 80. The phase comparator has negative and positive inputs, 180 and 150 respectively. The negative input 180 of the phase comparator 80 is connected to the output of the VCO 70 via a counter 100. A sync separator 90 is also connected to the analog input 170 of the ADC 20. In accordance with the present invention, the sync separator 90 has a line sync signal output 160 connected to the input of a selector 50. The selector 50 has a control input 130 connected to the output of timing logic 110 responsive to the positive input 150 of the phase comparator 150. The selector has two outputs respectively connected to the positive input 150 of the phase comparator 80 and to a reset input 120 of the counter 100.

In operation, video tape 140 is laced around the playback head 30. The playback head 30 is rotated as the video tape is drawn over it so that adjacent tracks on the video tape are read by diametrically opposite pickups 25,35 on the head 30 to reconstruct a video signal recorded on the tape 130 at the output of the signal conditioning amplifier 20. The ADC 10 samples the reconstructed video signal at intervals determined by a clock signal and converts each sample into a digital word. The VC0 70 generates the clock signal at the sampling clock input 60 of the ADC 10. The frequency of the clock signal is determined by the voltage level at the output of the phase comparator 80. The counter 100 divides the clock signal by the number of samples required in each line period. For example, to quantise each line of the video signal into 1000 samples, the counter is configured to divide the clock signal by 1000. The sync separator 90 extracts a line sync signal from the reconstructed video signal at the analog input 170 of the ADC 10. The output of the phase comparator 80 (the phase error signal) is determined by the phase difference between the line sync signal on the negative input 150 and the counter output on the positive input 180. The sampling clock signal therefore remains constant as long as the line sync pulses at the negative input 150 remain coincident with the pulses at the output of the counter 100. In accordance with the present invention, the timing logic 110 in combination with the selector 50 resets the counter upon detection of spurious line sync pulses, produced by, for example, video head skip, to prevent such pulses from disturbing the frequency of the clock signal.

Figure 3:
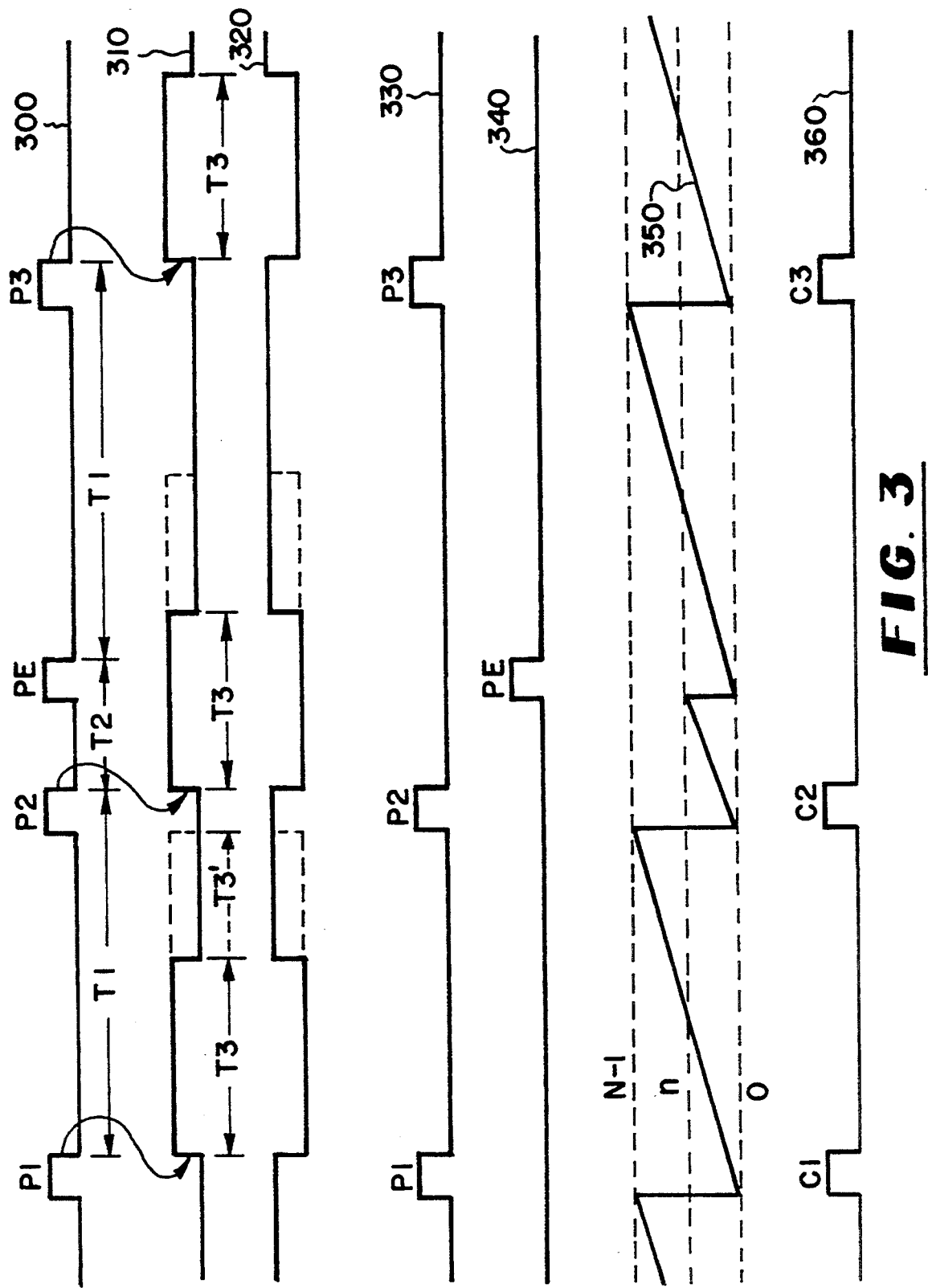
FIG. 3 is a timing diagram corresponding to the timing logic.

Referring to FIG. 3, a preferred example of the selector 50 comprises a pair of two input AND gates 200 and 210, and a preferred example of the timing logic 110 comprises an edge triggerable monostable circuit 220 having inverted and non inverted outputs, Q' and Q. One input of each of the AND gates 200 and 210 is connected to the sync separator output 160. The other input of AND gate 200 is connected to the non inverting output Q of the monostable circuit 220. The other input of AND gate 210 is connected to the inverting input Q' of the monostable circuit 220. The output of AND gate 200 is connected to the reset input 120 of the counter 100. The output of AND gate 210 is connected to the negative input 150 of the phase comparator 80 and to the trigger input of the monostable circuit 220. The monostable circuit 220 is configured to generate, in response to detection of a trailing edge in the line sync pulse signal, an output pulse of a length that is preset to be less than the line period but greater than the length of the time interval introduced by the spurious sync pulse.

Figure 4:
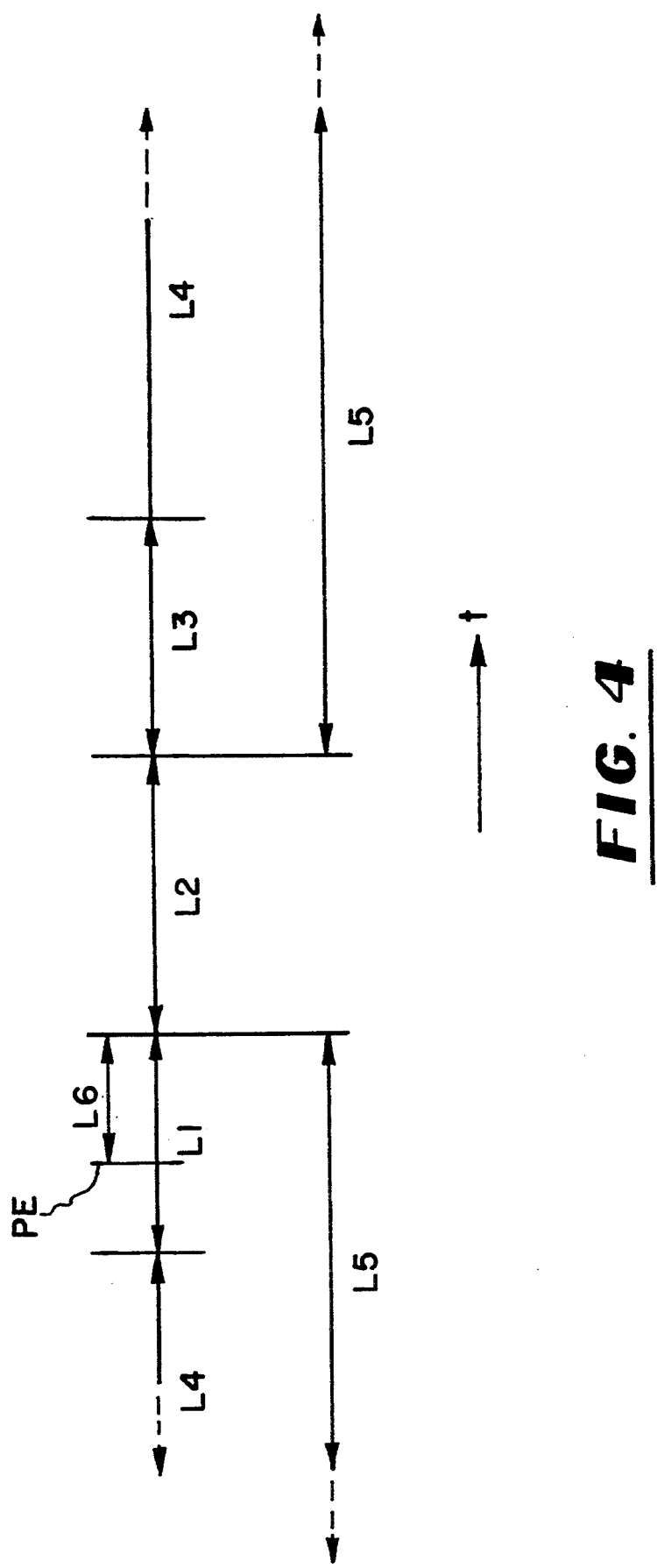
FIG. 4 is a timing diagram of a video signal reproduced from a video tape recording when played on a conventional, domestic video tape player.

Referring to FIG. 4, trace 300 represents a portion of the line sync pulse signal at the sync separator output 160. The portion comprises bona fide line sync pulses, P1 and P2 temporally separated by line period T1. A spurious sync pulse that may have been introduced by, for example, video head skip is temporally separated from pulse P2 by a period T2 that is usually much shorter than line period T1. For example, period T2 is typically 5 us for a line period T1 of 64 us. Pulse PE is separated from a subsequent pulse P3 by period T1.

Traces 310 and 320 respectively represent non-inverted and inverted outputs, Q and Q', of the monostable circuit. The trailing edges of pulses P1, P2 and P3 switch Q and Q' from stable states into metastable states for period T3. Period T3 is selected so that spurious pulse PE occurs when the inverted and non-inverted outputs Q and Q' are in their respective metastable states.

Trace 330 represents the positive input 150 to the phase comparator. Because inverted output Q' is in its metastable state during period T3, AND gate 210 is inhibited. Therefore, spurious pulse PE is not connected to the input of the phase comparator. However, when inverted output Q' returns to its stable state, AND gate 210 is enabled. Therefore, bona fide pulses P1, P2 and P3 are connected to the positive input 150 of the phase comparator.

Trace 340 represents the reset input 120 of the counter 100. Spurious pulse PE occurs when non-inverted output Q is in its metastable state. Therefore, spurious pulse PE is gated by AND gate 200 onto the reset input 120 of the counter 100. However, when non-inverted output Q returns to its stable state, AND gate 200 is inhibited. Therefore, bona fide pulses P1, P2 and P3 are not connected to the reset input 120 of the counter 100.

Because the sync separator output 160 is not connected to the trigger input of the monostable circuit 220 when the outputs Q and Q' of the monostable circuit 220 are in their respective metastable states, the trailing edge of pulse PE cannot retrigger the monostable circuit 220 and thus effectively extend period T3. However, in other embodiments of the present invention, the monostable circuit may be a non-retriggerable circuit with its trigger input connected to the sync separator output 160 rather than to the positive input 150 of the phase comparator 80.

Trace 350 represents the count stored in the counter during the portion of the line sync signal represented by trace 300. The count stored in the counter is incremented by each cycle of the clock signal. When the count reaches N−1, where N is the number of samples required in each line period, the counter generates an output pulse and the count resets to zero. Trace 360 represents the output of the counter during the portion of the line sync signal represented by trace 300. During line period T1, between line sync pulses P1 and P2, the count increases from zero to N−1. Upon detecting the next cycle of the sampling clock signal, the count resets and the counter generates output pulse C2. Because pulse C2 is coincident with pulse P1 at the phase comparator, the clock frequency remains constant. During time interval T3, between pulse P2 and spurious pulse PE, the count increases from zero to an intermediate value n which is lower than N−1. However, in accordance with the present invention, and with reference back to traces 330 and 340, pulse PE is diverted from the positive input 80 of the phase comparator onto the reset input 120 of the counter. Pulse PE therefore resets the count to zero. Thus, during line period T1 between pulses PE and P3, the count increments from zero to N−1 and not from n. Upon detecting the next cycle of the clock signal, the count resets and the counter generates output pulse C3. Because pulses C1, C2 and C3 at the output of the counter are coincident with the pulses P1, P2 and P3 at the at the phase comparator, the clock frequency remains constant despite the spurious pulse PE.

As aforementioned, period T2 is usually much shorter than line period T1. However, period T2 may occasionally extend in length. Therefore, in particularly preferred examples of the present invention, as indicated by the dashed lines in traces 310 and 320, the sensitivity of the timing logic 110 to the spurious line sync pulse PE is enhanced by extending the period for which Q and Q' are switched to their respective metastable states to T3'. It will be appreciated that the maximum value of T3' is equal to line period T1 less the width of one line sync pulse, because, if T3' is made longer, the counter 100 will be reset by bona fide line sync pulses, such as P1, P2 and P3 as well as spurious sync pulses PE.

In the embodiment of the present invention hereinbefore described, the clock signal is regulated in accordance with the present invention to determine the intervals at which a video signal is sampled by an analog to digital convertor 10 in an image processing system for digitising video signals reproduced by a conventional domestic video tape player. Because, in accordance with the present invention, the clock frequency is not varied by the spurious time intervals introduced by replaying the video tape, the digitised video signal is not temporally distorted and therefore may be displayed on a display device that does not overscan, or in a window on such a display device. It will however be appreciated that the present invention is not limited in application to video digitisation alone. In other embodiments of the present invention, the clock signal regulated in accordance with the present invention may be connected to counter logic for restoring the line sync signal of a video signal reproduced by a conventional domestic video tape player and fed directly into a non-overcanning display device without intermediate digitisation.

We claim:

1. Signal processing apparatus for processing line synchronization pulses in a line synchronization signal that define an analog video signal line period, the apparatus comprising:

a phase locked loop for generating a clock signal of a frequency that is a multiple of the line synchronization signal frequency, the phase locked loop comprising a phase comparator having a first input for receiving the line synchronization signal, a voltage controlled oscillator connected to the output of the phase comparator and a counter having an input connected to the output of the voltage controlled oscillator and an output connected to a second input of the phase comparator for dividing the clock signal from the voltage controlled oscillator by a number that is a function of the multiple of the line synchronization signal frequency; and logic for resetting the counter upon detection of any spurious pulse introducing a time interval into the line synchronization signal of less than the line period of the video signal, the logic comprising a multiplexer for switching the line synchronization signal from the first input to the phase comparator input of the phase locked loop to a reset input of the counter for a reset period, less than the line period, in response to each line synchronization pulse in the line synchronization signal and a timer for switching a control input of the multiplexer from a first state to a second state for the reset period upon detection of trailing edges of the line synchronization pulses in the line synchronization signal;

wherein the timer is a signal monostable multivibrator that has a trigger input connected to the phase comparator input and has inverted and non-inverted outputs, and wherein the multiplexer is a pair of AND gates, the inverted and non-inverted outputs of the monostable multivibrator respectively connected to the AND gates for respectively enabling different ones of the AND gates to thereby switch the line synchronization signal from the first input to the phase comparator input to the reset input of the counter.

2. Apparatus as claimed in claim 1, wherein the logic is configured to set the reset period to substantially the difference between the line period and a line synchronization pulse width.

3. The signal processing apparatus for defining the analog video signal line period as defined in claim 1, the apparatus further comprising an analog to digital convertor for digitizing samples of a video signal, having a line period defined by the signal processing apparatus, at intervals determined by the clock signal.

* * * * *